(12) United States Patent
Wei et al.

(10) Patent No.: US 10,204,938 B2
(45) Date of Patent: Feb. 12, 2019

(54) DISPLAY PANEL, DISPLAY APPARATUS, AND METHOD OF REPAIRING A SIGNAL LINE THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Pingyu Wei, Beijing (CN); Hewei Wang, Beijing (CN); Dong Guo, Beijing (CN); Lei Han, Beijing (CN); Min Xu, Beijing (CN); Nannan Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/567,182

(22) PCT Filed: Oct. 10, 2016

(86) PCT No.: PCT/CN2016/101684
§ 371 (c)(1),
(2) Date: Oct. 17, 2017

(87) PCT Pub. No.: WO2018/068183
PCT Pub. Date: Apr. 19, 2018

(65) Prior Publication Data
US 2018/0294291 A1    Oct. 11, 2018

(51) Int. Cl.
*H01L 27/12* (2006.01)
*H01L 25/18* (2006.01)
(Continued)

(52) U.S. Cl.
CPC ........ *H01L 27/1262* (2013.01); *G02F 1/1345* (2013.01); *G02F 1/13452* (2013.01);
(Continued)

(58) Field of Classification Search
CPC ............. H01L 27/1262; H01L 27/3276; H01L 27/124; H01L 25/18
See application file for complete search history.

(56) References Cited

U.S. PATENT DOCUMENTS 8,083,561 B1 * 12/2011 Huang .............. G02F 1/136259
                                                          345/76
9,275,932 B2 * 3/2016 Yoshida .............. G02F 1/13452
(Continued)

FOREIGN PATENT DOCUMENTS

CN    101236738 A    8/2008
CN    101930128 A    12/2010
(Continued)

OTHER PUBLICATIONS

International Search Report & Written Opinion dated Jul. 11, 2017, regarding PCT/CN2016/101684.

*Primary Examiner* — William Coleman
(74) *Attorney, Agent, or Firm* — Intellectual Valley Law, P.C.

(57) ABSTRACT

The present application discloses a display panel having a driver integrated circuit (IC) bonding area for bonding a plurality of signal lines with a driver IC. The display panel includes a signal line layer comprising the plurality of signal lines, first ends of which extending through the driver IC bonding area; a shorting bar layer comprising one or more shorting bar, a first end of each of the plurality of signal lines being electrically connected to only one of the one or more shorting bar; and a first repair line layer in the peripheral
(Continued)

area comprising a first repair line crossing over and being insulated from the one or more shorting bar.

20 Claims, 7 Drawing Sheets

(51) Int. Cl.
 *G02F 1/1362* (2006.01)
 *G02F 1/1345* (2006.01)
 *H01L 27/32* (2006.01)
 *H01L 51/56* (2006.01)
 *G02F 1/1368* (2006.01)

(52) U.S. Cl.
 CPC .. *G02F 1/136259* (2013.01); *G02F 1/136286* (2013.01); *H01L 25/18* (2013.01); *H01L 27/124* (2013.01); *H01L 27/3276* (2013.01); *G02F 1/1368* (2013.01); *G02F 2001/136263* (2013.01); *H01L 51/56* (2013.01); *H01L 2251/568* (2013.01)

(56) References Cited

U.S. PATENT DOCUMENTS

| | | | |
|---|---|---|---|
| 9,418,582 B2* | 8/2016 | Chang | G09G 3/006 |
| 9,921,446 B2* | 3/2018 | Yu | G01R 31/025 |
| 2004/0041959 A1* | 3/2004 | Yoo | G02F 1/136204 |
| | | | 349/43 |
| 2012/0026076 A1 | 2/2012 | Huang et al. | |
| 2014/0028537 A1* | 1/2014 | Song | G02F 1/1333 |
| | | | 345/98 |
| 2015/0212379 A1 | 7/2015 | Wang et al. | |

FOREIGN PATENT DOCUMENTS

| | | |
|---|---|---|
| CN | 102520534 A | 6/2012 |
| CN | 103197479 A | 7/2013 |
| CN | 103235459 A | 8/2013 |
| CN | 104898341 A | 9/2015 |
| JP | 2008310209 A | 12/2008 |
| KR | 20050011475 A | 1/2005 |
| TW | 201205172 A | 2/2012 |

* cited by examiner

DISPLAY PANEL, DISPLAY APPARATUS, AND METHOD OF REPAIRING A SIGNAL LINE THEREOF

CROSS-REFERENCE TO RELATED APPLICATION

This application is a national stage application under 35 U.S.C. § 371 of International Application No. PCT/CN2016/101684, filed Oct. 10, 2016, the contents of which are incorporated by reference in the entirety.

TECHNICAL FIELD

The present invention relates to a display panel, a display apparatus having the same, and a method of repairing a signal line thereof.

BACKGROUND

Display panels includes a number of various types of signal lines, e.g., data lines, gate lines, and touch control lines. These signal lines provide voltage signals essential to the image display function of the display panels. For example, the data lines provide data signals to the subpixels in the display panels, and the gate lines provides gate scanning signals to each row of subpixels in the display panels. When a signal line is damaged, the voltage signal cannot be transmitted to the damaged signal line. As a result, the subpixels along the damaged signal line cannot receive voltage signal for image display, resulting in dark line defect.

SUMMARY

In one aspect, the present invention provides a display panel having a driver integrated circuit (IC) bonding area for bonding a plurality of signal lines with a driver IC; the display panel comprising a signal line layer comprising the plurality of signal lines, first ends of which extending through the driver IC bonding area; a shorting bar layer comprising one or more shorting bar, a first end of each of the plurality of signal lines being electrically connected to only one of the one or more shorting bar; and a first repair line layer in a peripheral area comprising a first repair line crossing over and being insulated from the one or more shorting bar.

Optionally, the display panel further comprises a second repair line layer comprising a second repair line in the peripheral area; the second repair line crossing over and being electrically insulated from a second end of each of the plurality of signal lines; the second repair line being configured to be electrically connected to the first repair line through the driver IC.

Optionally, the first repair line extending through the driver IC bonding area into a signal line area in the peripheral area.

Optionally, the shorting bar layer comprises a plurality of shorting bars; the first end of each of the plurality of signal lines being electrically connected to only one of the plurality of shorting bar.

Optionally, the shorting bar layer comprises a first shorting bar and a second shorting bar; a first end of each of odd numbered signal lines is electrically connected to the first shorting bar, and a first end of each of even numbered signal lines is electrically connected to the second shorting bar.

Optionally, the shorting bar layer comprises a first shorting bar, a second shorting bar, and a third shorting bar; a first end of each signal line connected to a red subpixel is electrically connected to the first shorting bar, a first end of each signal line connected to a green subpixel is electrically connected to the second shorting bar, and a first end of each signal line connected to a blue subpixel is electrically connected to the third shorting bar.

Optionally, the first repair line layer comprises a plurality of first repair lines, each of which extending through a same driver IC bonding area; the plurality of signal lines in the driver IC bonding area are substantially parallel to the plurality of first repair lines.

Optionally, the display panel further comprises an insulating layer between the first repair line layer and the shorting bar layer.

Optionally, the display panel further comprises an insulating layer between the second repair line layer and the signal line layer.

Optionally, the one or more shorting bar is on a side of the driver IC bonding area distal to a display area.

In another aspect, the present invention provides a method of repairing a damaged signal line of a display panel as described herein, comprising electrically disconnecting the one or shorting bar from each of the plurality of signal lines other than a damaged signal line; electrically connecting the first repair line to a shorting bar electrically connected to the damaged signal line; and electrically connecting the second repair line to a second end of the damaged signal line.

Optionally, the step of electrically disconnecting the one or more shorting bar from each of the plurality of signal lines other than the damaged signal line comprises electrically disconnecting the one or more shorting bar from all of the plurality of signal lines; and electrically connecting the damaged signal line to a corresponding shorting bar.

Optionally, the method comprising laser cutting all of the plurality of signal lines in an area between the shorting bar layer and the driver IC bonding area; and depositing a conductive material in a laser cut portion of the damage signal line thereby electrically connecting the damaged signal line to the corresponding shorting bar.

Optionally, the method further comprises forming a protective coating on the conductive material in the laser cut portion.

Optionally, the method comprising forming a protective coating on the damaged signal line in an area between the one or more shorting bar and the driver IC bonding area; wherein the protective coating is resistant to laser cutting; and laser cutting each of the plurality of signal lines other than the damaged signal line in an area between the shorting bar layer and the driver IC bonding area while electrical connection between the damaged signal line and a corresponding shorting bar is maintained.

Optionally, the step of electrically connecting the first repair line to the shorting bar electrically connected to the damaged signal line is perforated by welding the first repair line with the shorting bar electrically connected to the damaged signal line at an intersection where the first repair line crosses over the shorting bar electrically connected to the damaged signal line.

Optionally, the step of electrically connecting the second repair line to a second end of the damaged signal line is performed by welding the second repair line with the damaged signal line at an intersection where the second repair line crosses over the damaged signal line.

In another aspect, the present invention provides a display panel repaired by a method described herein.

In another aspect the present invention provides a display apparatus comprising a display panel described herein or repaired by a method described herein, a driver IC connecting the first repair line and the second repair line; and a printed circuit board.

Optionally, the display apparatus further comprises a third repair line in the printed circuit board; the first repair line and the second repair line are electrically connected to the third repair line through the driver IC.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1A:
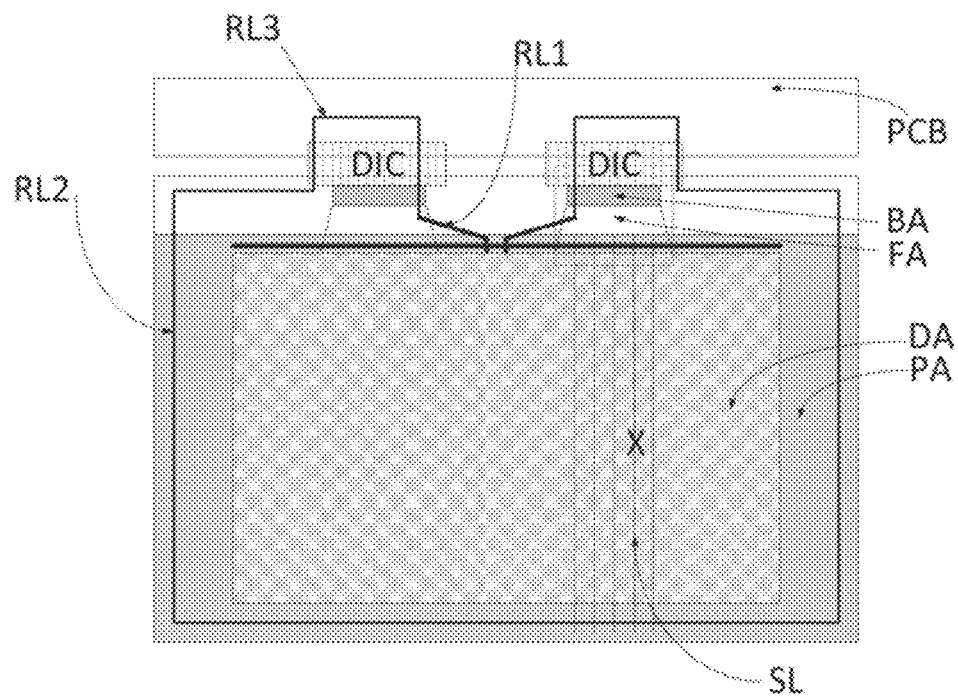
FIG. 1A is a diagram illustrating the structure of a conventional display apparatus.
Figure 1B:
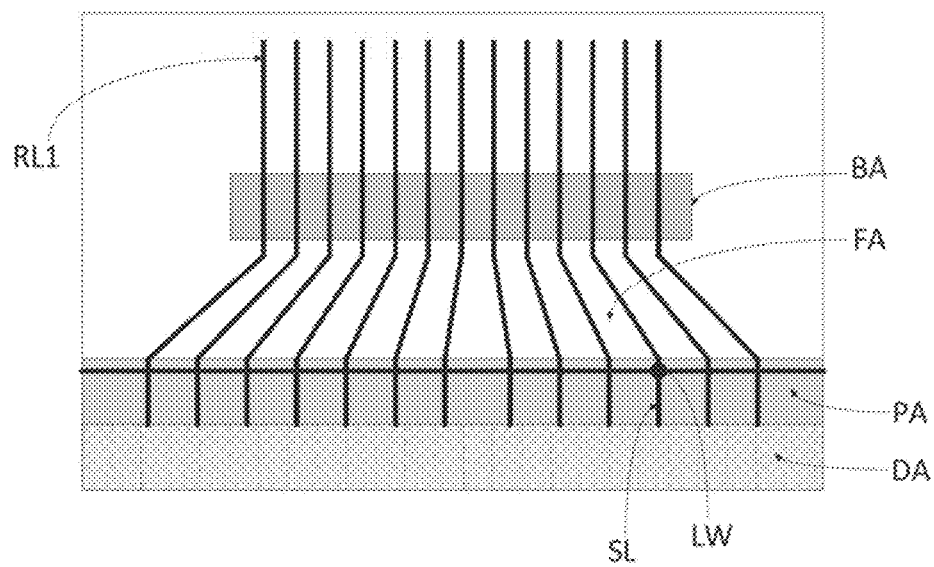
FIG. 1B is a diagram illustrating a signal line repairing structure corresponding to the region circled by dotted line in FIG. 1A.

FIG. 1A is a diagram illustrating the structure of a conventional display apparatus. FIG. 1B is a diagram illustrating a signal line repairing structure corresponding to the region circled by dotted line in FIG. 1A. Referring to FIGS. 1A and 1B, the conventional display apparatus typically includes a display panel and a printed circuit board PCB connected to the display panel through a driver IC DIC. The conventional display panel typically includes a display area DA, a peripheral area PA, and a driver integrated circuit (IC) bonding area BA in the peripheral area PA for bonding a plurality of signal lines SL with a driver IC DIC. As shown in FIG. 1A, the display panel includes a plurality of signal lines SL, one of which has an open circuit (indicated by X). The signal line repairing structure in the conventional display apparatus typically include a signal line terminal repair line RL1, a peripheral repair line RL2, and a printed circuit board repair line RL3. The signal line SL has a first end proximal to the driver IC bonding area BA, and a second end distal to the driver IC bonding area BA. As shown in FIG. 1B, the first ends of the plurality of signal lines extend through the driver IC bonding area. The signal line terminal repair line RL1 crosses over and is insulated from the first ends of the plurality of signal lines SL, and the peripheral repair line RL2 crosses over and is insulated from second ends of the plurality of signal lines SL.

To repair a damaged signal line, the first end of the damaged signal line is electrically connected to the signal line terminal repair line RL1 by laser welding the signal line terminal repair line RL1 with the damaged signal line at an intersection where the signal line terminal repair line RL1 crosses over the damaged signal line; and the second end of the damaged signal line is electrically connected to the peripheral repair line RL2 by laser welding the peripheral repair line RL2 with the damaged signal line at an intersection where the peripheral repair line RL2 crosses over the damaged signal line. During image display, a voltage signal (e.g., a data signal or a gate scanning signal or a touch control signal) is transmitted to the first end of the repaired signal line from a pin in the driver IC DIC, and is transmitted from the pin to the second end of the repaired signal line through the signal line terminal repair line RL1, the printed circuit board repair line RL3, and the peripheral repair line RL2.

In the conventional signal line repairing structure, the signal line terminal repair line crosses over all of the plurality of signal lines. The length of the signal line terminal repair line results in high resistance in the repair circuit. Because it crosses over a large number of signal lines, capacitance between the signal line terminal repair line and the plurality of signal lines becomes very large. The high resistance results in a significant voltage drop in the voltage signal provided to the repaired signal line. The large capacitance results in increased propagation delay of the voltage signal provided to the repaired signal line. These problems become increasingly severe as the size of the display panel increases. The conventional signal line repairing structure is ineffective in repairing damaged signal lines in a large size display panel e.g., a panel larger than 32 inches.

Accordingly, the present invention provides, inter alia, a display panel having a novel signal line repair structure, a display apparatus having the same, and a method of repairing a signal line thereof that substantially obviate one or more of the problems due to limitations and disadvantages of the related art. In one aspect, the present disclosure provides a display panel having a display area, a peripheral area, and a driver IC bonding area in the peripheral area for bonding a plurality of signal lines with a driver IC. In some embodiments, the display panel includes a signal line layer including the plurality of signal lines extending through the driver IC bonding area; a shorting bar layer including one or more shorting bar; and a first repair line layer including a first repair line in the peripheral area crossing over and being insulated from the one or more shorting bar. A first end of each of the plurality of signal lines is electrically connected to only one of the one or more shorting bar. Optionally, the shorting bar layer is on a side of the driver IC bonding area distal to the display area. Optionally, the display panel further includes a second repair line layer including a second repair line in the peripheral area. The second repair line crosses over and is electrically insulated from a second end of each of the plurality of signal lines. The second repair line is configured to be electrically connected to the first repair line through the driver IC.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

The signal line may be any appropriate signal line. Optionally, the plurality of signal lines are a plurality of data lines, and the driver IC is a data driver IC. Optionally, the plurality of signal lines are a plurality of gate lines, and the driver IC is a gate driver IC. Optionally, the plurality of signal lines are a plurality of touch control lines, and the driver IC is a touch control driver IC.

Figure 2A:
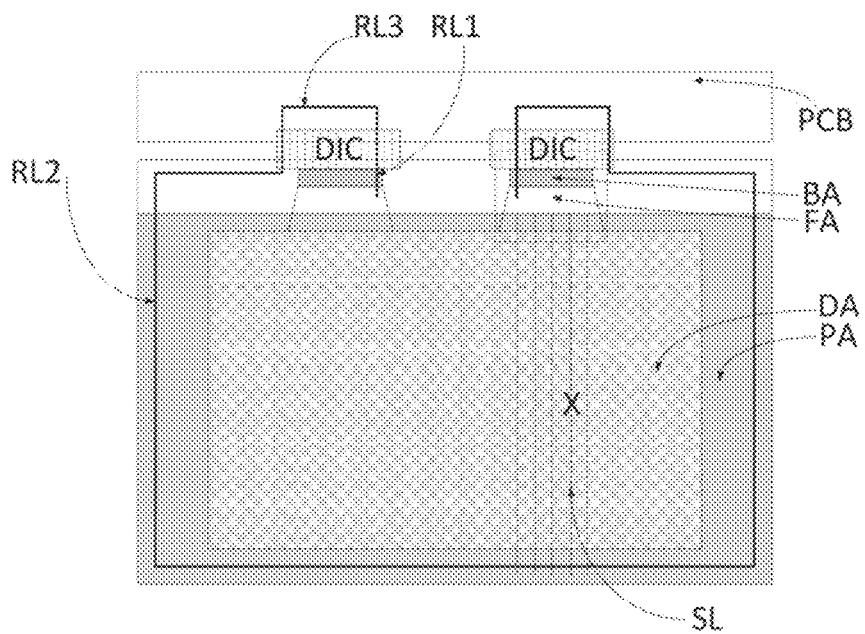
FIG. 2A a diagram illustrating the structure of a display apparatus in some embodiments according to the present disclosure.

FIG. 2A a diagram illustrating the structure of a display apparatus in some embodiments according to the present disclosure. Referring to FIG. 2A, the display apparatus in the embodiment includes a display panel and a printed circuit board PCB connected to the display panel through a driver IC DIC. The display panel includes a display area DA, a peripheral area PA, and a driver IC bonding area BA in the peripheral area PA for bonding a plurality of signal lines SL with a driver IC DIC. As shown in FIG. 2A, the display panel includes a signal line layer including a plurality of signal lines SL. When there is a signal line open circuit (indicated by X in FIG. 2A) in one of the signal lines, display defects (e.g., a dark line) occur on the display panel. The present display panel includes a novel and superior signal line repairing structure. As shown in FIG. 2A, the signal line repairing structure includes a first repair line layer having a first repair line RL1, and a second repair line layer having a second repair line RL2. The first repair line RL1 is disposed in the peripheral area, extending through the driver IC bonding area BA. The second repair line RL2 is disposed in the peripheral area. The second repair line RL2 crosses over, and is electrically insulated from, an end of each of the plurality of signal lines (e.g., an end opposite to the driver IC bonding area BA in the display panel). Optionally, the signal line repairing structure further includes a third repair line layer having a third repair line RL3. The third repair line RL3 is disposed in the printed circuit board. The first repair line RL1 and the second repair line RL2 are electrically connected to the third repair line RL3 through the driver IC DIC. Optionally, the first repair line RL1 is configured to be electrically connected to the second repair line RL2 through the driver IC DIC (e.g., without a third repair line RL3).

Figure 2B:
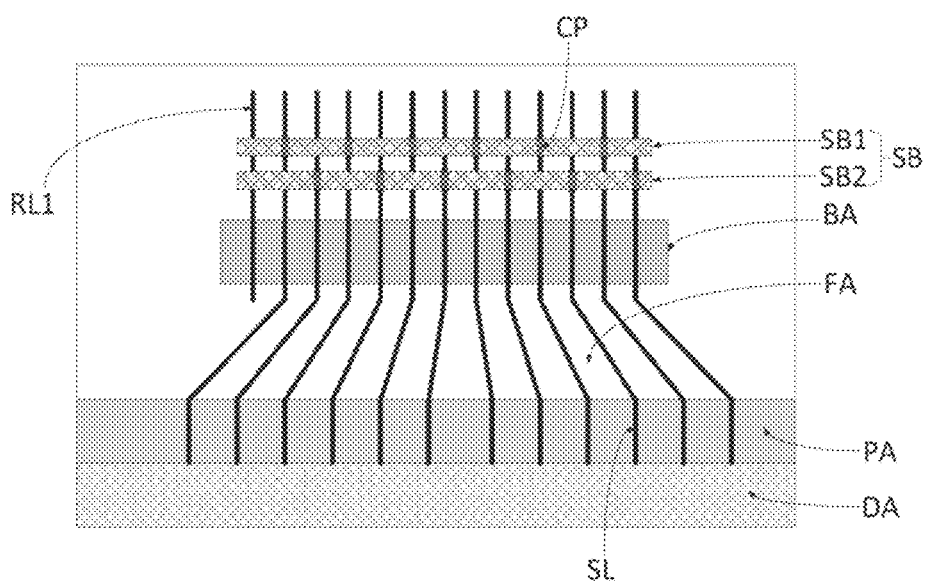
FIG. 2B is a diagram illustrating a signal line repairing structure corresponding to the region circled by dotted line in FIG. 2A.

FIG. 2B is a diagram illustrating a signal line repairing structure corresponding to the region circled by dotted line in FIG. 2A. Referring to FIG. 2B, the signal line repairing structure includes a signal line layer having a plurality of signal lines SL extending through the driver IC bonding area BA; a shorting bar layer SB having one or more shorting bar on a side of the driver IC bonding area BA distal to the display area DA; and a first repair line layer having a first repair line RL1 in the peripheral area PA crossing over and being insulated from the one or more shorting bar. A first end of each of the plurality of signal lines SL is electrically connected to only one of the one or more shorting bar through a connecting point CP. The first repair line RL1 is electrically connected to the driver IC through the driver IC bonding area BA. Optionally, the first repair line RL1 extends through the driver IC bonding area BA into a fan-out area FA in the peripheral area PA. Optionally, the first repair line RL1 extends into the driver IC bonding area BA and is electrically connected to the driver IC in the driver IC bonding area BA (e.g., the first repair line RL1 does not extend through the driver IC bonding area BA).

Referring to FIG. 2B, the shorting bar layer SB in the embodiment includes two shorting bars, e.g., a first shorting bar SB1 (top) and a second shorting bar SB2 (bottom). As discussed above, the first end of each of the plurality of signal lines SL is electrically connected to only one of the one or more shorting bar, e.g., either the first shorting bar SB1 or the second shorting bar SB2, but not both. In FIG. 2B, a first end of each of odd numbered signal lines SL is electrically connected to the first shorting bar SB1, and a first end of each of even numbered signal lines SL is electrically connected to the second shorting bar SB2. Optionally, a first end of each of signal lines on the left side of the driver IC bonding area BA is electrically connected to the first shorting bar SB1, and a first end of each of signal lines on the right side of the driver IC bonding area BA is electrically connected to the second shorting bar SB2.

The first repair line layer and the shorting bar layer SB may be electrically connected to each other in numerous alternative ways. In some embodiments, the shorting bar layer SB includes only one shorting bar, and all of the plurality of signal lines are electrically connected to the only one shorting bar. In some embodiments, the shorting bar layer includes a plurality of shorting bars, and the first end of each of the plurality of signal lines is electrically connected to only one of the plurality of shorting bar. For example, in some embodiments, the shorting bar layer SB includes a first shorting bar, a second shorting bar, and a third shorting bar. Optionally, a first end of each signal line connected to a red subpixel in the display panel is electrically connected to the first shorting bar, a first end of each signal line connected to a green subpixel in the display panel is electrically connected to the second shorting bar, and a first end of each signal line connected to a blue subpixel in the display panel is electrically connected to the third shorting bar. In some embodiments, the shorting bar layer SB includes a first shorting bar, a second shorting bar, a third shorting bar, and a fourth shorting bar. Optionally, a first end of each signal line connected to a red subpixel in the display panel is electrically connected to the first shorting bar, a first end of each signal line connected to a green subpixel in the display panel is electrically connected to the second shorting bar, a first end of each signal line connected to a blue subpixel in the display panel is electrically connected to the third shorting bar, and a first end of each signal line connected to a white subpixel in the display panel is electrically connected to the fourth shorting bar.

In some embodiments, the display panel further includes an insulating layer between the signal line layer and the shorting bar layer. The insulating layer electrically insulates each signal line from any shorting bar other than the one electrically connected to the signal line. For example, the insulating layer may insulate odd numbered signal lines SL from the second shorting bar SB2, and even numbered signal lines SL from the first shorting bar SB1. Optionally, the insulating layer may be formed by forming a plurality of insulating blocks only at the intersection between each signal line and any shorting bar other than the one electrically connected to the signal line. Optionally, the insulating layer may be formed by first forming an insulating material layer between all signal lines and all shorting bars, followed by welding each signal line with a corresponding shorting bar at an intersection where the signal line crosses over the corresponding shorting bar.

In some embodiments, the first repair line layer includes only one first repair line RL1 (as shown in FIG. 2B). In some embodiments, the first repair line layer includes a plurality of first repair lines. Optionally, each of the plurality of first repair lines extends through a same driver IC bonding area. Optionally, each of the plurality of signal lines in the driver IC bonding area are substantially parallel to the plurality of first repair lines. The plurality of first repair lines may be disposed on one side of the plurality of signal lines. Optionally, the plurality of first repair lines may be disposed on two sides of the plurality of signal lines, respectively.

In some embodiments, the display panel further includes an insulating layer between the first repair line layer and the shorting bar layer. Each of the plurality of the first repair lines is electrically insulated from each of the shorting bars. Optionally, the insulating layer between the first repair line layer and the shorting bar layer may be formed in a same patterning process as the insulating layer between the signal line layer and the shorting bar layer.

As discussed above, the second repair line crosses over and is electrically insulated from a second end of each of the plurality of signal lines. Optionally, the second end and the first end are on two opposite sides of the display panel. In some embodiment, the display panel further includes an insulating layer between the second repair line layer and the signal line layer. In the process of repairing a damaged signal line, the second repair line may be electrically connected to the damaged signal line at the second end, e.g., by welding the second repair line with the damaged signal line at an intersection where the second repair line crosses over the damaged signal line. For example, the second repair line may be electrically connected to the damaged signal line at the second end by laser welding the intersection and forming a via penetrating through the insulating layer.

Figure 2C:
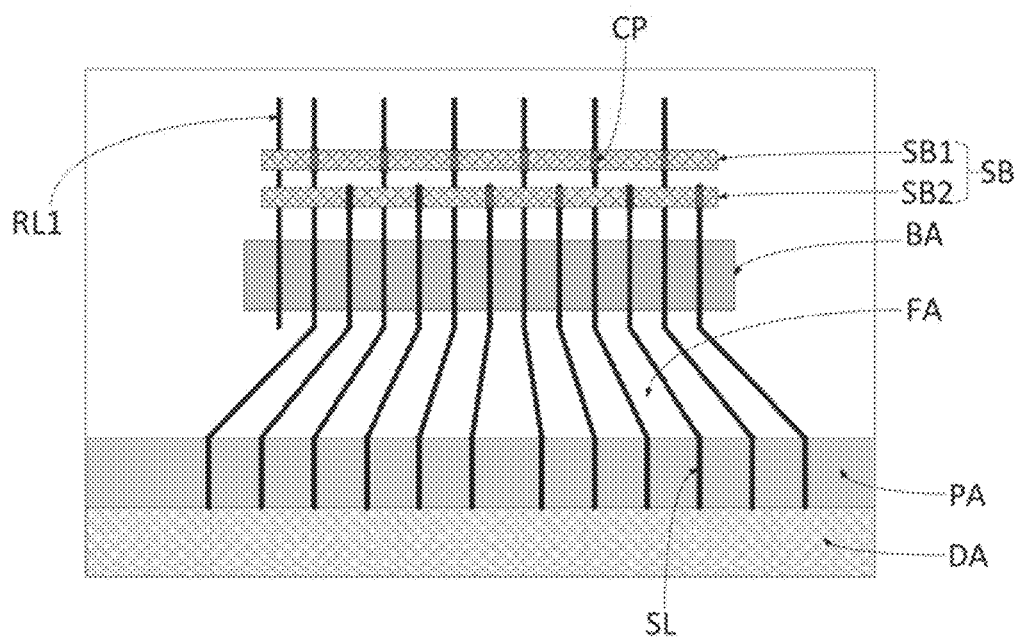
FIG. 2C is a diagram illustrating a signal line repairing structure in some embodiments according to the present disclosure.

Numerous alternative embodiments may be employed to implement the present signal line repairing structure. FIG. 2C is a diagram illustrating a signal line repairing structure in some embodiments according to the present disclosure. Referring to FIG. 2C, each odd numbered signal line SL has a length different from that of each even numbered signal line SL. A first end of each of odd numbered signal lines SL is electrically connected to the first shorting bar SB1, and a first end of each of even numbered signal lines SL is electrically connected to the second shorting bar SB2. Optionally, the display panel further includes an insulating layer between the second shorting bar SB2 and odd numbered signal lines SL.

Figure 2D:
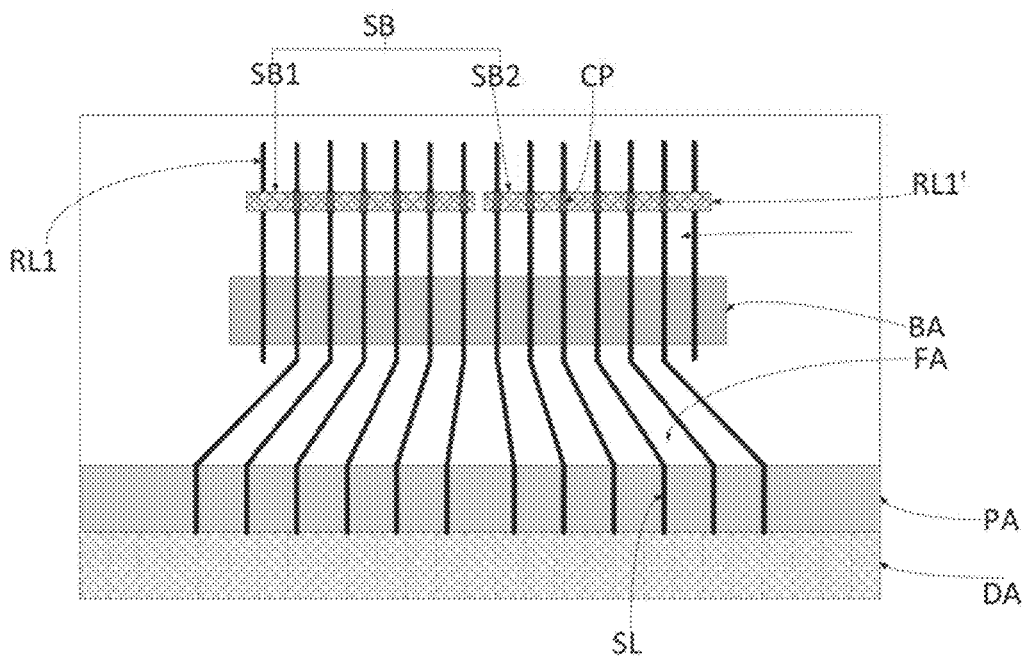
FIG. 2D is a diagram illustrating a signal line repairing structure in some embodiments according to the present disclosure.

FIG. 2D is a diagram illustrating a signal line repairing structure in some embodiments according to the present disclosure. Referring to FIG. 2D, the first repair line layer in the embodiment includes two first repair lines, RL1 and RL1', on two sides of the driver IC bonding area, respectively. The shorting bar layer in the embodiment includes two shorting bars, SB1 and SB2, corresponding to two first repair lines RL1 and RL1'. As shown in FIG. 2D, a first end of each of signal lines SL on the left side of the driver IC bonding area BA is electrically connected to the first shorting bar SB1, and a first end of each of signal lines SL on the right side of the driver IC bonding area BA is electrically connected to the second shorting bar SB2. Two shorting bars SB1 and SB2 are insulated from each other. A projection of the shorting bar SB1 and a projection of the shorting bar SB2 on the driver IC bonding area BA are substantially non-overlapping. This design obviates the need to have an insulating layer between the shorting bar layer SB and the signal line layer, simplifies the fabrication process. Moreover, this design enables repairing of two damaged signal lines SL extending through a same driver IC bonding area BA. For example, when a signal line SL on the left side of the driver IC bonding area BA and a signal line SL on the right side of the driver IC bonding area BA are both damaged, they can be repaired by the first repair line RL1 and the first repair line RL1'.

Similarly, the display panel may include more than two first repair lines in a same driver IC bonding area. These first repair lines may be disposed on two sides of the signal lines. Optionally, at least some first repair lines may be disposed between two adjacent signal lines, e.g., in the middle of the driver IC bonding area.

The shoring bar layer may include a row of a plurality of shorting bars (as shown in FIG. 2D). Optionally, the shorting bar layer may include a plurality of rows of shorting bars. Optionally, each row of shorting bars may include two shorting bars (as shown in FIG. 2D). Optionally, each row of shorting bars may include more than two shorting bars.

In another aspect, the present disclosure provides a method of repairing a damaged signal line of a display panel, for example, a display panel as described herein. In some embodiments, the method includes electrically disconnecting the one or more shorting bar from each of the plurality of signal lines other than a damaged signal line; electrically connecting the first repair line to a shorting bar electrically connected to the damaged signal line; and electrically connecting the second repair line to a second end of the damaged signal line.

Figure 3A:
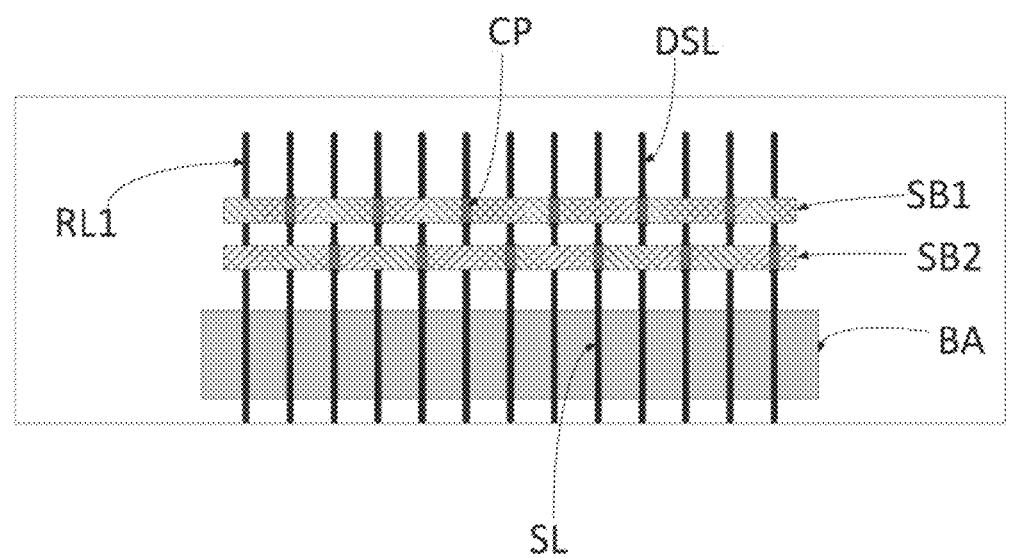
FIGS. 3A-3D illustrate a process of repairing a damaged signal line in some embodiments according to the present disclosure.
Figure 3B:
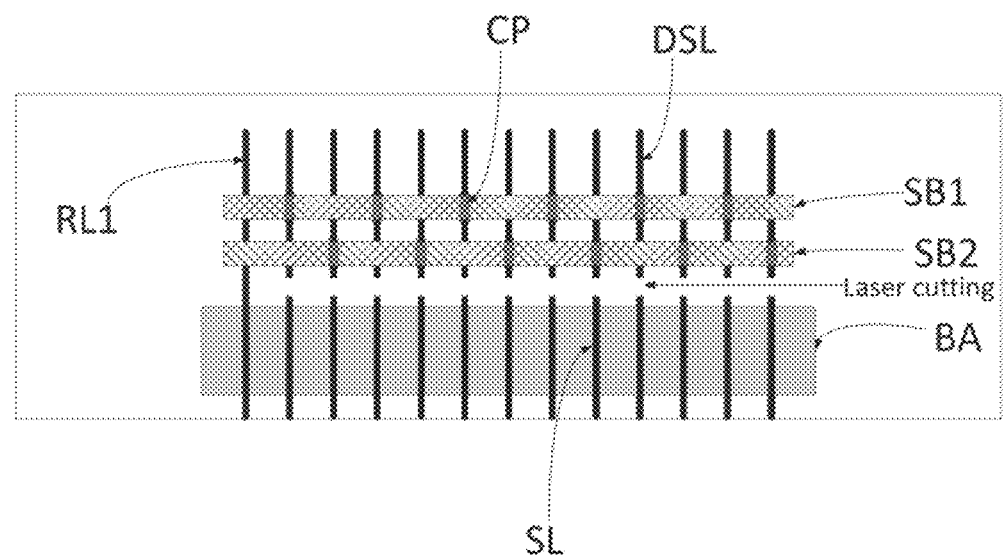
Figure 3C:
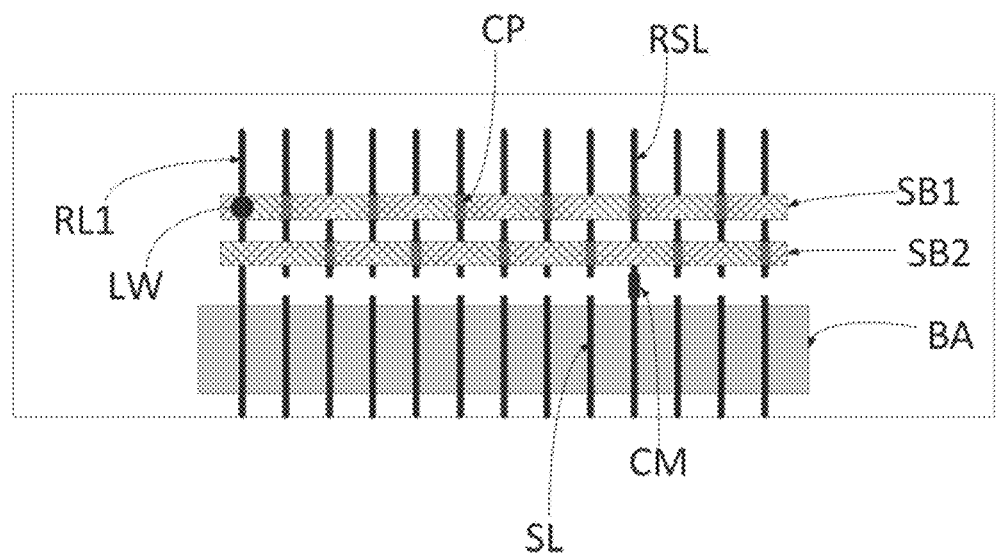
Figure 3D:
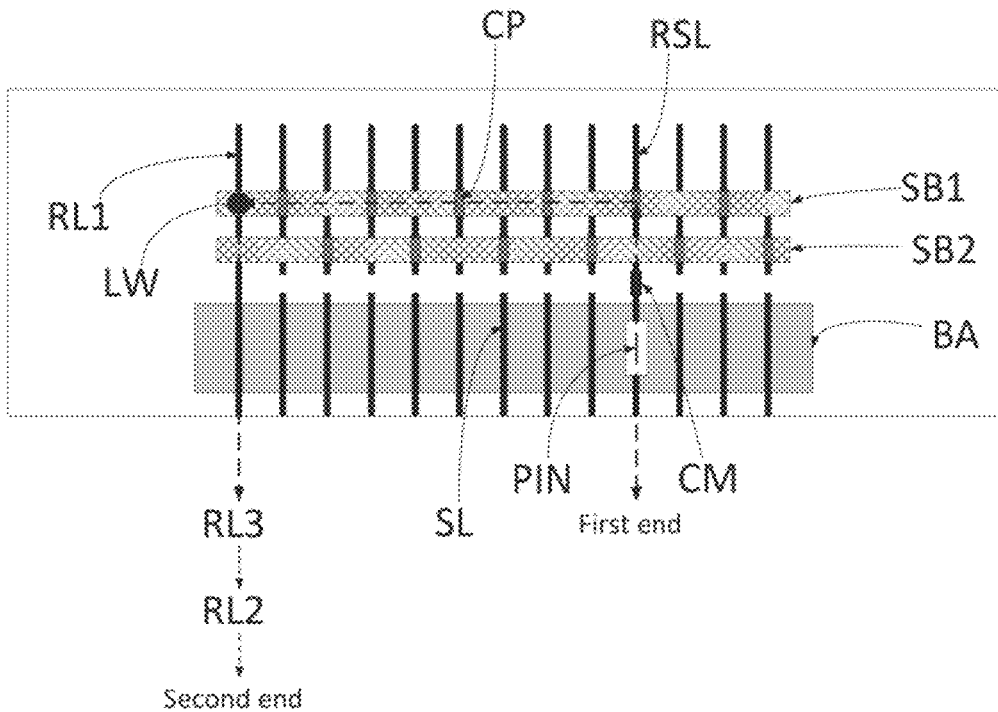

In some embodiments, the step of electrically disconnecting the one or more shorting bar from each of the plurality of signal lines other than the damaged signal line includes electrically disconnecting the one or more shorting bar from all of the plurality of signal lines; and electrically connecting the damaged signal line to a corresponding shorting bar. FIGS. 3A-3D illustrate a process of repairing a damaged signal line in some embodiments according to the present disclosure. Referring to FIG. 3A, the display panel includes a damaged signal line DSL, which is electrically connected to the first shorting bar SB1. To repair the damaged signal line DSL, all of the plurality of signal lines extending through the driver IC bonding area BA are cut in an area between the shorting bar layer and the driver IC bonding area, e.g., by laser cutting (FIG. 3B). Subsequently, the damaged signal line in the cut region is electrically reconnected, e.g., by ink-jet printing a conductive material CM or depositing a conductive material CM in the laser cut portion of the damaged signal line DSL (FIG. 3C), thereby forming a repaired signal line RSL. The first repair line RL1 and the first shorting bar SB1 may be electrically connected by, e.g., laser welding (FIG. 3C) the two at an intersection LW where the first repair line RL1 crosses over the first shorting bar SB1. FIG. 3D is a circuit diagram of a repaired display panel. In FIG. 3D, a pin PIN from a driver IC is shown to be bonded is the driver IC bonding area BA. The voltage signal (e.g., a data voltage signal or a gate scanning signal or a touch control signal) is transmitted from the pin PIN to the display panel. Along a first direction, the voltage signal is transmitted directly to the repaired signal line RSL, providing a voltage signal to the first end of the repaired signal line RSL. Along a second direction, the voltage signal is transmitted to the first shorting bar SB1 through the portion having the conductive material CM, and to the first repair line RL1 through the laser welded portion LW. The second repair line may be electrically connected to a second end of the damaged signal line by laser welding the second repair line with the damaged signal line at an intersection where the second repair line crosses over the damaged signal line. The voltage signal is in turn transmitted from the first repair line RL1 to the third repair line RL3 and the second repair line RL2. The voltage signal is provided to the second end of the repaired signal line RSL through the second repair line RL2 as the second repair line RL2 is now electrically connected to the second end of the repaired signal line RSL. By having a same voltage signal provided to both ends of the repaired signal line RSL, the signal line open circuit is repaired.

Any appropriate conductive material may be used to reconnect the laser cut portion of the damaged signal line. Optionally, the conductive material is a metal or an alloy. Examples of appropriate conductive materials include, but are not limited to, copper, tungsten, and gold. Optionally, a protective coating may be applied on the conductive material CM at the laser cut portion. Examples of protective coating materials resistant to laser cutting include, but are not limited to, high temperature silicone, silicon nitride, silicon oxide, and tuff coating material.

Optionally, prior to the laser cutting step, a protective coating may be applied on the first repair line in an area between the shorting bar layer and the driver IC bonding area, to prevent inadvertent cutting of the first repair line.

Figure 4A:
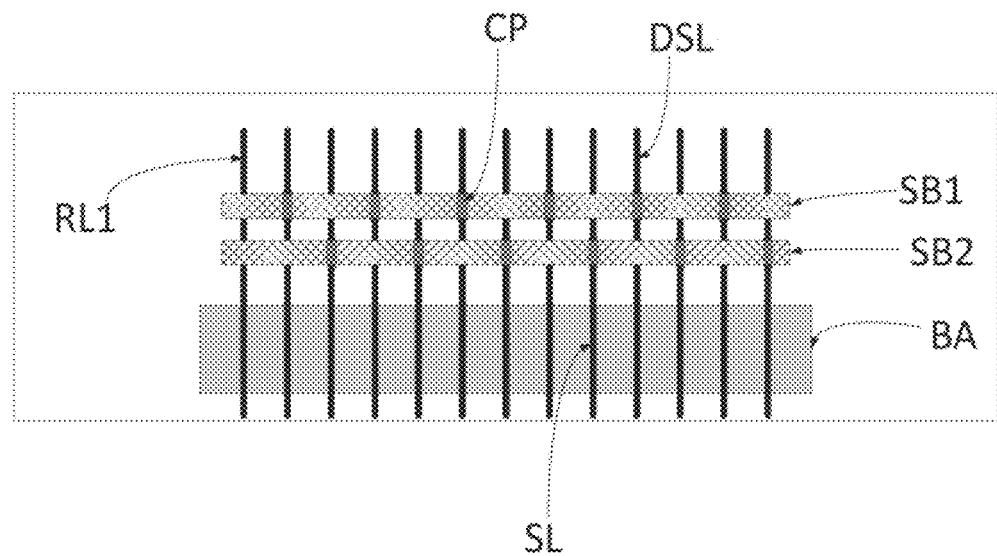
FIGS. 4A-4D illustrate a process of repairing a damaged signal line in some embodiments according to the present disclosure.
Figure 4B:
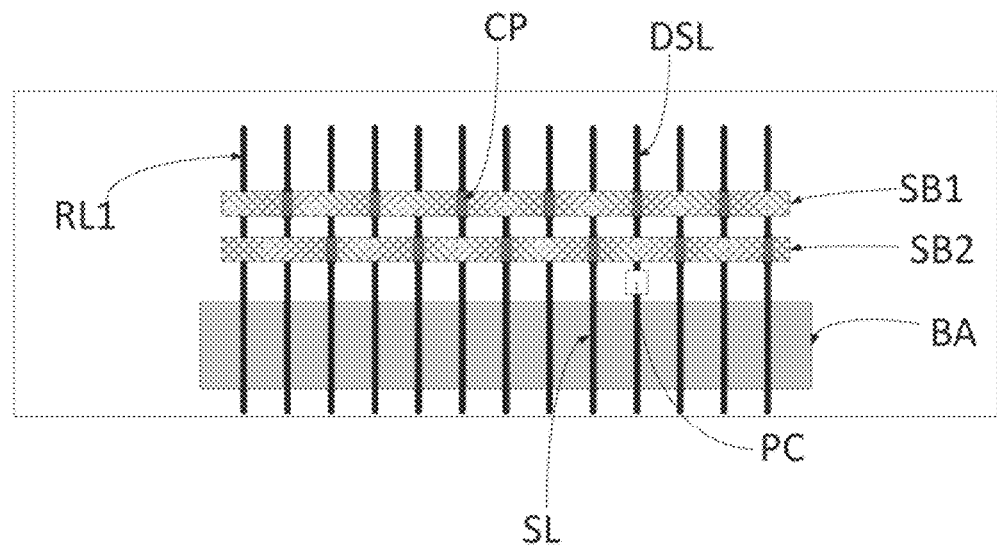
Figure 4C:
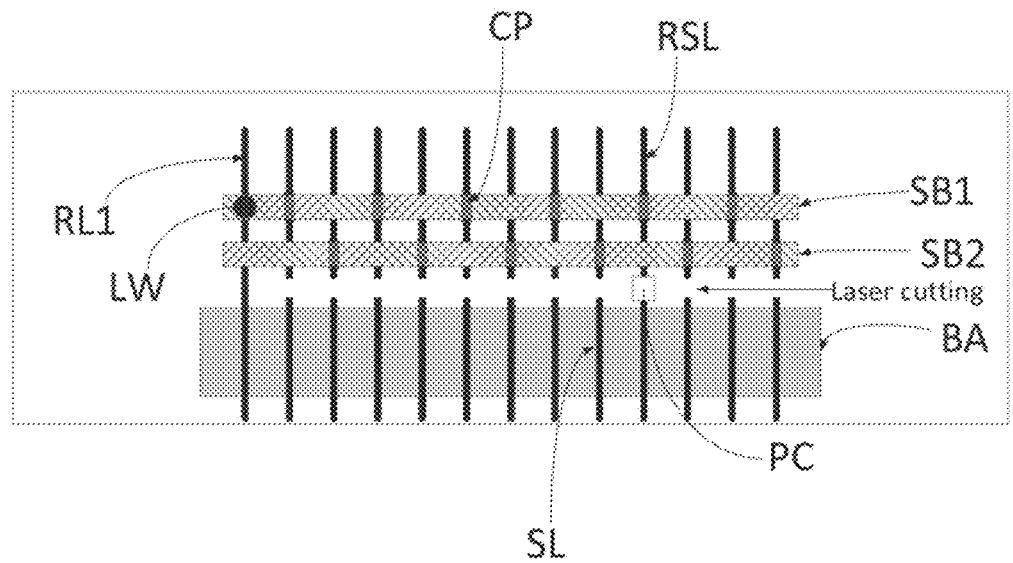
Figure 4D:
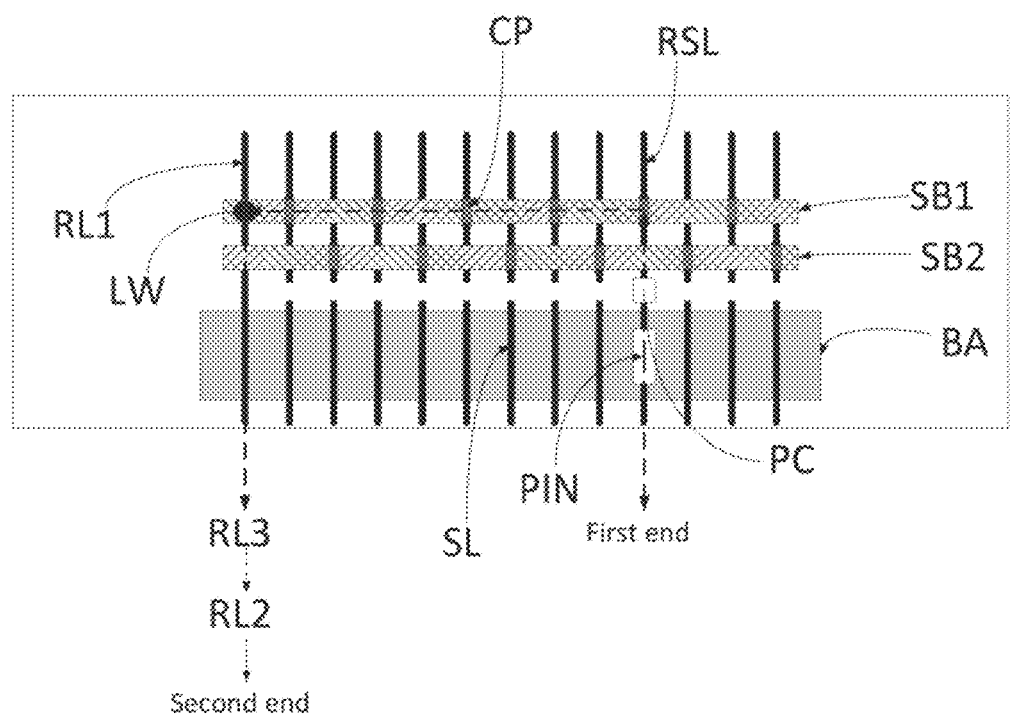

In some embodiments, prior to the laser cutting step, a protective coating may be applied on the damaged signal line in an area between the shoring bar layer and the driver IC bonding area, to prevent cutting of the damaged signal line. FIGS. 4A-4D illustrate a process of repairing a damaged signal line in some embodiments according to the present disclosure. Referring to FIG. 4A, the display panel includes a damaged signal line DSL, which is electrically connected to the first shorting bar SB1. Referring to FIG. 4B, a protective coating PC is applied on the damaged signal line DSL in an area between the second shorting bar SB2 and the driver IC bonding area BA, to prevent cutting of the damaged signal line DSL. Referring to FIG. 4C, each of the plurality of signal lines SL other than the damaged signal line DSL in an area between the shorting bar layer and the driver IC bonding area is cut, e.g., by laser cutting. Due to the protective coating PC, the damaged signal line is not cut by the laser in this area, the electrical connection between the damaged signal line and a corresponding shorting bar is maintained. The first repair line RL1 and the first shorting bar SB1 may be electrically connected by, e.g., laser welding (FIG. 4C) the two at an intersection LW where the first repair line RL1 crosses over the first shorting bar SB1. FIG. 4D is a circuit diagram of a repaired display panel. In FIG. 4D, a pin PIN from a driver IC is shown to be bonded in the driver IC bonding area BA. The data voltage signal is transmitted from the pin PIN to the display panel. Along a first direction, the voltage signal (e.g., a data signal or a gate scanning signal or a touch control signal) is transmitted directly to the repaired signal line RSL, providing a voltage signal to the first end of the repaired signal line RSL. Along a second direction, the voltage signal is transmitted to the first shorting bar SB1 through the repaired signal line RSL, and to the first repair line RL1 through the laser welded portion LW. The voltage signal is in turn transmitted from the first repair line RL1 to the third repair line RL3 and the second repair line RL2. The second repair line may be electrically connected to a second end of the damaged signal line by laser welding the second repair line with the damaged signal line at an intersection where the second repair line crosses over the damaged signal line. The voltage signal is provided to the second end of the repaired signal line RSL through the second repair line RL2 as the second repair line RL2 is now electrically connected to the second end of the repaired signal line RSL. By having a same voltage signal provided to both ends of the repaired signal line RSL, the signal line open circuit is repaired.

In another aspect, the present invention provides a display panel repaired by a method described herein. In some embodiments, the repaired display panel include a display area, a peripheral area, and a driver integrated circuit (IC) bonding area in the peripheral area for bonding a plurality of signal lines with a driver IC. In some embodiments, the display panel includes a signal line layer including a plurality of signal lines and at least one repaired signal line. The plurality of signal lines and the repaired signal line extend through the driver IC bonding area. The repaired display panel further includes a shorting bar layer including one or more shorting bar; and a first repair line layer including a first repair line in the peripheral area crossing over the one or more shorting bar. The first repair line is electrically connected to only one shorting bar and insulated from all other shorting bars. The plurality of signal lines are insulated from the shorting bar layer. For example, the display panel may include a gap (e.g., a laser cut portion) spacing apart the plurality of signal lines and the shorting bar layer. A first end of the repaired signal line, however, is electrically connected to only one of the one or more shorting bar. Moreover, the first repair line is electrically connected to the only one of the one or more shorting bar, e.g., by a connecting point formed by laser welding. Optionally, the shorting bar layer is on a side of the driver IC bonding area distal to the display area.

The repaired display panel further includes a second repair line layer including a second repair line in the peripheral area. The second repair line crosses over and is electrically insulated from a second end of each of the plurality of signal lines. The second repair line, however, is electrically connected to a second end of the repaired signal line, e.g., by a connecting point formed by laser welding. The second repair line is configured to be electrically connected to the first repair line through the driver IC.

In another aspect, the present invention provides a repaired display apparatus having a display panel described herein or a display panel repaired according to a method described herein. In some embodiments, the display apparatus further includes a driver IC and a printed circuit board. Optionally, the first repair line and the second repair line are connected through the driver IC. Optionally, the display panel further includes a third repair line in the printed circuit board for connecting the first repair line and the second repair line. The first repair line and the second repair line are electrically connected to the third repair line through the driver IC. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a driver integrated circuit (IC) bonding area for bonding a plurality of signal lines with a driver IC; the display panel comprising:
    a signal line layer comprising the plurality of signal lines, first ends of which extending through the driver IC bonding area;
    a shorting bar layer comprising one or more shorting bar, a first end of each of the plurality of signal lines being electrically connected to only one of the one or more shorting bar; and
    a first repair line layer in a peripheral area comprising a first repair line crossing over and being insulated from the one or more shorting bar;
    wherein the first repair line extends through the driver IC bonding area and does not cross over any of the plurality of signal lines.

2. The display panel of claim 1, further comprising a second repair line layer comprising a second repair line in the peripheral area; the second repair line crossing over and being electrically insulated from a second end of each of the plurality of signal lines; the second repair line being configured to be electrically connected to the first repair line through the driver IC.

3. The display panel of claim 1, wherein the first repair line extends through the driver IC bonding area into a signal line area in the peripheral area.

4. The display panel of claim 1, wherein the shorting bar layer comprises a plurality of shorting bars; the first end of each of the plurality of signal lines is electrically connected to only one of the plurality of shorting bar.

5. The display panel of claim 1, wherein the first repair line layer comprises a plurality of first repair lines, each of which extending through a same driver IC bonding area; the plurality of signal lines in the driver IC bonding area are substantially parallel to the plurality of first repair lines.

6. The display panel of claim 1, further comprising an insulating layer between the first repair line layer and the shorting bar layer.

7. The display panel of claim 1, wherein the one or more shorting bar is on a side of the driver IC bonding area distal to a display area.

8. A display apparatus, comprising:
    a display panel of claim 1;
    a driver IC connecting the first repair line and the second repair line; and
    a printed circuit board.

9. The display panel of claim 2, further comprising an insulating layer between the second repair line layer and the signal line layer.

10. The display panel of claim 4, wherein the shorting bar layer comprises a first shorting bar and a second shorting bar; a first end of each of odd numbered signal lines is electrically connected to the first shorting bar, and a first end of each of even numbered signal lines is electrically connected to the second shorting bar.

11. The display panel of claim 4, wherein the shorting bar layer comprises a first shorting bar, a second shorting bar, and a third shorting bar; a first end of each signal line connected to a red subpixel is electrically connected to the first shorting bar, a first end of each signal line connected to a green subpixel is electrically connected to the second shorting bar, and a first end of each signal line connected to a blue subpixel is electrically connected to the third shorting bar.

12. The display apparatus of claim 8, further comprising a third repair line in the printed circuit board; the first repair line and the second repair line are electrically connected to the third repair line through the driver IC.

13. A method of repairing a damaged signal line of a display panel having a driver integrated circuit (IC) bonding area for bonding a plurality of signal lines with a driver IC:
    wherein the display panel comprises a signal line layer comprising the plurality of signal lines, first ends of which extending through the driver IC bonding area; a shorting bar layer comprising one or more shorting bar, a first end of each of the plurality of signal lines being electrically connected to only one of the one or more shorting bar; a first repair line layer in a peripheral area comprising a first repair line crossing over and being insulated from the one or more shorting bar; and a second repair line layer comprising a second repair line in the peripheral area;
    wherein the first repair line extends through the driver IC bonding area and does not cross over any of the plurality of signal lines;
    the second repair line crosses over and is electrically insulated from a second end of each of the plurality of signal lines; and
    the second repair line is configured to be electrically connected to the first repair line through the driver IC;
    the method comprising:
    electrically disconnecting the one or more shorting bar from each of the plurality of signal lines other than a damaged signal line;
    electrically connecting the first repair line to a shorting bar electrically connected to the damaged signal line; and
    electrically connecting the second repair line to a second end of the damaged signal line.

14. The method of claim 13, wherein the step of electrically disconnecting the one or more shorting bar from each of the plurality of signal lines other than the damaged signal line comprises:
- electrically disconnecting the one or more shorting bar from all of the plurality of signal lines; and
- electrically connecting the damaged signal line to a corresponding shorting bar.

15. The method of claim 13, comprising:
- forming a protective coating on the damaged signal line in an area between the one or more shorting bar and the driver IC bonding area; wherein the protective coating is resistant to laser cutting; and
- laser cutting each of the plurality of signal lines other than the damaged signal line in an area between the shorting bar layer and the driver IC bonding area while electrical connection between the damaged signal line and a corresponding shorting bar is maintained.

16. The method of claim 13, wherein the step of electrically connecting the first repair line to the shorting bar electrically connected to the damaged signal line is performed by welding the first repair line with the shorting bar electrically connected to the damaged signal line at an intersection where the first repair line crosses over the shorting bar electrically connected to the damaged signal line.

17. The method of claim 13, wherein the step of electrically connecting the second repair line to a second end of the damaged signal line is performed by welding the second repair line with the damaged signal line at an intersection where the second repair line crosses over the damaged signal line.

18. A display panel repaired by a method of claim 13.

19. The method of claim 14, comprising:
- laser cutting all of the plurality of signal lines in an area between the shorting bar layer and the driver IC bonding area; and
- depositing a conductive material in a laser cut portion of the damage signal line thereby electrically connecting the damaged signal line to the corresponding shorting bar.

20. The method of claim 19, further comprising forming a protective coating on the conductive material in the laser cut portion.

* * * * *